US011647577B2

(12) United States Patent
Ramachandran et al.

(10) Patent No.: US 11,647,577 B2
(45) Date of Patent: May 9, 2023

(54) IONIZED GAS VENT TO REDUCE ON WAFER STATIC CHARGE AND PARTICLES

(71) Applicant: APPLIED MATERIALS, INC., Santa Clara, CA (US)

(72) Inventors: Narayanan Ramachandran, Bangalore (IN); Devendra Channappa Holeyannavar, Bangalore (IN); Dean Chris Hruzek, Cedar Park, TX (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 513 days.

(21) Appl. No.: 16/790,344

(22) Filed: Feb. 13, 2020

(65) Prior Publication Data

US 2021/0259087 A1      Aug. 19, 2021

(51) Int. Cl.
*B08B 5/00*       (2006.01)
*B08B 6/00*       (2006.01)
*B08B 7/04*       (2006.01)
*H01L 21/67*      (2006.01)
*H05F 3/04*       (2006.01)
*H05F 3/06*       (2006.01)

(52) U.S. Cl.
CPC ............... *H05F 3/06* (2013.01); *B08B 5/00* (2013.01); *B08B 6/00* (2013.01); *B08B 7/04* (2013.01); *H01L 21/67017* (2013.01); *H01L 21/67167* (2013.01); *H01L 21/67201* (2013.01); *H05F 3/04* (2013.01)

(58) Field of Classification Search
None
See application file for complete search history.

(56) References Cited

U.S. PATENT DOCUMENTS

| | | |
|---|---|---|
| 5,382,311 A | 1/1995 | Ishikawa et al. |
| 8,409,328 B2 | 4/2013 | Yamawaku et al. |
| 9,385,015 B2 | 7/2016 | Yamawaku et al. |
| 2008/0067368 A1 | 3/2008 | Avery |
| 2010/0214712 A1 | 8/2010 | Yamawaku et al. |
| 2012/0211029 A1 | 8/2012 | Pandit et al. |
| 2016/0035563 A1 | 2/2016 | Lin et al. |

*Primary Examiner* — Levon J Shahinian
(74) *Attorney, Agent, or Firm* — Lowenstein Sandler LLP (57) ABSTRACT

Disclosed is a wafer processing system, a load lock system, a chamber system, and methods of neutralizing static charges and dislodging particles from a wafer. The chamber system (e.g., load lock system) may comprise a chamber (e.g., load lock chamber), at least one ionizer to ionize inert gas supplied to the chamber (e.g., load lock chamber), at least one bottom nozzle to flow ionized inert gas to a bottom surface of a wafer, at least one top nozzle to flow ionized inert gas to a top surface of a wafer, and at least one exhaust vent to remove the ionized inert gas and any neutralized particles dislodged from the wafer. The chamber may include a single wafer or multiple wafers. The chamber system may further comprise at least one nozzle to flow an inert gas curtain proximate to an exit and/or entry into the chamber.

10 Claims, 6 Drawing Sheets

IONIZED GAS VENT TO REDUCE ON WAFER STATIC CHARGE AND PARTICLES

FIELD OF THE DISCLOSURE

Embodiments of the present disclosure relate generally to methods and to a system for transferring wafers. More specifically, the present disclosure relates to a method and system for neutralizing static charge and cleaning particles from wafers while transferring wafers through a chamber, such as a load lock chamber (e.g., from a storage module to a process module and vice versa).

BACKGROUND OF THE DISCLOSURE

In electronic device manufacturing, wafers (e.g., silicon-containing wafers, silicon-containing plates) may be moved about manufacturing facilities and within manufacturing equipment tools. During such movements, particles and static charges may accumulate on the surface of the wafers. Static charges on wafers may lead to electrostatic discharge (ESD), such as electrical short or dielectric breakdown, if not removed. ESD and particle contaminations may adversely affect the wafer processing and may ultimately adversely affect chip performance. Hence, reduction in on wafer static charge may improve overall performance of chips generated on the wafer. Also, reduction in particle contamination may contribute to higher cleanliness and potential particle dispersal, which may improve the yield and quality of wafers produced.

SUMMARY OF THE DISCLOSURE

In certain embodiments, the instant disclosure is directed to a method for neutralizing static charges on at least one wafer. The method comprises flowing ionized inert gas into a load lock chamber from at least one bottom nozzle to neutralize static charge on a bottom surface of at least one wafer. The method further comprises flowing ionized inert gas into the load lock chamber from at least one top nozzle to neutralize static charge on a top surface of the at least one wafer. The method further comprises removing the ionized inert gas that was supplied into the load lock chamber from the at least one bottom nozzle and from the at least one top nozzle along with particles dislodged from at least one of the top surface or the bottom surface out of the load lock chamber through at least one exhaust vent positioned at the bottom of the load lock chamber through at least one exhaust vent.

In certain embodiments, the instant disclosure is directed to a load lock system. The load lock system comprises a load lock chamber, at least one ionizer, at least one bottom nozzle, at least one top nozzle, and at least one exhaust vent. The at least one ionizer is used to ionize inert gas supplied to the load lock chamber, wherein an output of the at least one ionizer is ionized inert gas. The at least one bottom nozzle is positioned at the bottom of the load lock chamber and may be used to flow the ionized inert gas onto a bottom surface of at least one wafer in the load lock chamber. The ionized inert gas, when flowed onto the bottom surface of the at least one wafer, neutralizes static charge on a bottom surface of the at least one wafer. The at least one top nozzle is positioned at the top of the load lock chamber and may be used to flow ionized inert gas onto a top surface of at least one wafer. The ionized inert gas, when flowed onto the top surface of the at least one wafer, neutralizes static charge on the top surface of the at least one wafer. The at least one exhaust vent is positioned at the bottom of the load lock chamber and may be used to remove the ionized inert gas and any neutralized particles dislodged from at least one of the top surface or bottom surface from the load lock chamber.

In certain embodiments, the instant disclosure is directed to a chamber system. The chamber a chamber, at least one ionizer, at least one bottom nozzle, at least one top nozzle, and at least one exhaust vent. The at least one ionizer is used to ionize inert gas supplied to the chamber, wherein an output of the at least one ionizer is ionized inert gas. The at least one bottom nozzle is positioned at the bottom of the chamber and may be used to flow the ionized inert gas onto a bottom surface of at least one wafer in the chamber. The ionized inert gas, when flowed onto the bottom surface of the at least one wafer, neutralizes static charge on a bottom surface of the at least one wafer. The at least one top nozzle is positioned at the top of the chamber and is used to flow ionized inert gas onto a top surface of at least one wafer. The ionized inert gas, when flowed onto the top surface of the at least one wafer, neutralizes static charge on the top surface of the at least one wafer. The at least one exhaust vent is positioned at the bottom of the chamber and is used to remove the ionized inert gas and any neutralized particles dislodged from at least one of the top surface or bottom surface from the chamber.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION

In electronic device manufacturing processes, wafers (e.g., silicon wafers, silicon-containing plates, etc.) configured to produce electronic components (e.g., electronic chips or electronic subcomponents thereof) are moved, often via use of one or more robots, through a number of manufacturing phases. During wafer transportation, the wafer surfaces may get charged and particles may gather on the charged surfaces. Such electrostatic charges may lead to an electrostatic discharge event (such as electrical short or dielectric breakdown), which could result in an insulator becoming electrically conductive. Additionally, particle accumulation may lead to further wafer defects. Flowing ionized inert gas to the wafer surfaces assists in neutralizing charges on the wafer surfaces and allows particles gathered on the surfaces to break free (i.e., dislodge) and so they can be removed.

Ionizers may be used to ionize inert gas in the factory interface portion and/or in a load lock chamber of a wafer processing system in attempts to neutralize surface charges on wafer surfaces in the factory interface. Flowing the ionized inert gas in the load lock chamber neutralizes electrostatic charges (e.g., ions) and removes particles from wafers at a section that is closer to the wafer processing chambers than the factory interface, and thus may provide advantages over the use of ionized gas to remove static charge from wafers in a factory interface. An exemplary advantage of static charge and particle removal at a section closer to the wafer processing chambers is that there is less opportunities for the wafer to accumulate additional static charges and be exposed to additional particles that could adhere thereto. If static charges and particles are removed from a wafer at the factory interface section, additional static charges may accumulate on a wafer and additional particles could adhere to a wafer as it transfers from the factory interface to the load lock chamber or in the load lock chamber itself. In comparison, if particles are removed from a wafer at the load lock chamber section, a clean wafer (of static charges and particles) is transferred into the vacuum environment of the main frame and processing chambers. The vacuum environment of the main frame and processing chambers has less particles that could adhere to the wafer and the resulting wafer would be cleaner of static charges and charged particles as compared to a wafer that was subjected to ionized inert gas at the factory interface section alone and not at the load lock chamber section.

Furthermore, the load lock chamber encloses a smaller volume than the volume enclosed by a factory interface, allowing for a more intense, efficient, and cost effective charge neutralization and particle removal as compared to charge removal at the factory interface. For instance, a conventional factory interface may have a volume of about 1500 liters. In comparison, a conventional single wafer load lock chamber may have a volume of about 15 liters, which is 1% of the volume of a conventional factory interface. The lower volume of the load lock chamber allows for better and more accurate ionized inert gas delivery and lower consumption of ionized inert gas (e.g., ionized nitrogen).

Further, neutralizing wafer surface charges in a load lock chamber also allows for individualized treatment of each wafer which may not be accomplished in the factory interface section. If a load lock chamber is a multi-wafer load lock chamber, then two or more wafers may be treated in parallel to discharge an electrical charge on each of the wafers in the multi-wafer load lock chamber.

Additionally, the placement of nozzle(s) delivering ionized inert gas in a load lock and their operation sequence may be designed such that each surface of the wafer (e.g., bottom surface and top surface) get fully exposed to ionized inert gas to attain thorough charge neutralization and particle removal. The amount of particles in vacuum is low but even a low number of particles could interfere with future processing of the wafer and cause wafer defects. Furthermore, removing electrostatic charges and particles from the top surface of a wafer only (the surface of the wafer where processing occurs) may not be sufficient. Electrostatic charges and particles that adhere to the bottom surface of the wafer could migrate from the bottom surface of the wafer to the top surface of the wafer as the wafer travels through various processing units. In this manner, electrostatic charges and particles that were once adhered to the bottom surface of the wafer may be disruptive with future wafer processing and cause wafer defects. It is beneficial to remove particles from all sides of a wafer and to remove as many particles as possible.

Yet another advantage of inline ionizers for use in a load lock chamber according to this disclosure is the ability to operate them on an as-needed intermittent basis (e.g., when a wafer is loaded into the load lock chamber during a vacuum-vent cycle). In contrast, ionizers that are used in the factory interface operate continuously and may be less cost efficient. For instance, operating the ionizer unit during a vacuum-vent cycle in the load lock, as opposed to continuously operating it in the factory interface, could reduce the operation/use time of the ionizer unit by at least about 50%. The 50% reduction in the operation/use time of the ionizer unit is calculated in an example by assuming a hypothetical scenario of a throughput of 180 wafers per hour, 90 wafers passes per load-lock with two load-lock chambers, 20 second per vacuum-vent cycle. In this hypothetical scenario, an ionizer in the factory interface would operate continuously over the entire hour that it would take to process 180 wafers. In comparison, an ionizer operating only during the vacuum-vent cycle in the load lock chambers would operate for 20 seconds for each wafer (a total of 30 minutes calculated as follows: 20 seconds×90 wafers=1800 seconds=30 minutes), which is at least half the operation/use time of a factory interface ionizer subjected to continuous operation.

While certain embodiments described herein refer to load lock chambers, the disclosure should not be construed as limited to such applications. The instant disclosure may apply to any chamber or port that may be isolated and vented, such as, without limitations, processing chambers, vacuum storage buffer, load ports, side storage pod (SSP), front opening unified pod (FOUP), and the like. The instant disclosure may be applied in chambers/ports with or without a vacuum environment. Accordingly, any combination of the embodiments that are described herein with respect to a load lock chamber (such as, without limitations, at least one bottom nozzle, at least one top nozzle, at least one exhaust vent, at least one ionizer, at least one additional nozzle for supplying an inert gas curtain, and so on) may be utilized in other chambers/ports within a wafer processing system.

The instant disclosure describes a load lock system, chamber system, wafer processing system, and methods for neutralizing charges and/or removing particles in said load lock system and wafer processing system.

In an exemplary embodiment, the instant disclosure is directed to a load lock system comprising a load lock chamber, at least one ionizer, at least one bottom nozzle positioned at the bottom of the load lock chamber (e.g., two bottom nozzles), at least one top nozzle positioned at the top of the load lock chamber (e.g., two top nozzles), and at least one exhaust vent positioned at the bottom of the load lock chamber (e.g., two exhaust vents). In another exemplary embodiment, the instant disclosure may be directed to a chamber system comprising a chamber, at least one ionizer, at least one bottom nozzle positioned at the bottom of the chamber (e.g., two bottom nozzles), at least one top nozzle positioned at the top of the chamber (e.g., two top nozzles), and at least one exhaust vent positioned at the bottom of the chamber (e.g., two exhaust vents).

The least one ionizer may be an inline ionizer to ionize inert gas supplied into the chamber (e.g., load lock chamber)

from an inert gas source (e.g., nitrogen source). The output of the at least one ionizer may be ionized inert gas (e.g., ionized nitrogen).

The at least one bottom nozzle may flow ionized inert gas (e.g., ionized nitrogen) onto a bottom surface of at least one wafer in the chamber (e.g., load lock chamber). The ionized inert gas, when flowed onto the bottom surface of the at least one wafer may neutralize static charges on the bottom surface of the at least one wafer in the chamber (e.g., load lock chamber).

The at least one top nozzle may flow ionized inert gas (e.g., ionized nitrogen) onto a top surface of the at least one wafer in the chamber (e.g., load lock chamber). The ionized inert gas, when flowed onto the top surface of the at least one wafer may neutralize static charges on the top surface of the at least one wafer in the chamber (e.g., load lock chamber).

In certain embodiments, the load lock chamber system may further comprise at least one additional nozzle to flow an inert gas curtain proximate to an interface of the load lock chamber and the factory interface. In certain embodiments, the chamber system may further comprise at least one additional nozzle to flow an inert gas curtain proximate to an entry to—and/or an exit from—the chamber.

The inert gas curtain may further reduce the number of particles entering into the chamber (e.g., load lock chamber) when at least one wafer enters into the chamber or exits from the chamber (e.g., transfers between the factory interface and the load lock chamber).

The inert gas curtain and the nozzle(s) that flow it may be inside the chamber (e.g., load lock chamber) or outside the chamber (e.g., load lock chamber).

In one embodiment, the inert gas curtain and nozzle may be placed by an atmospheric slit valve that separates the load lock chamber from an atmospheric environment. The inert gas curtain may supply inert gas or ionized inert gas when the wafer is transferred from the factory interface into the load lock chamber and/or when the wafer is transferred from the load lock chamber into the factory interface.

The load lock chambers contemplated herein may be a single wafer load lock chamber as well as a multi-wafer load lock chamber in which a plurality of wafers in a batch may be subjected to charge neutralization and particle removal. Similarly, the chambers contemplated herein may include a single wafer or a plurality of wafers.

In another exemplary embodiment, the instant disclosure may be directed to a wafer processing system comprising a factory interface, at least one processing chamber, and any of the load lock systems and/or chamber systems described herein.

In yet another exemplary embodiment, the instant disclosure may be directed to a method for neutralizing static charges on a wafer's surface and/or for removing particles from the wafer's surface. The method may comprise flowing ionized inert gas (e.g., ionized nitrogen) into a chamber (e.g., load lock chamber) from at least one bottom nozzle to neutralize static charges on a bottom surface of at least one wafer (e.g., in an upward direction). The method may further comprise flowing ionized inert gas into a chamber (e.g., load lock chamber) from at least one top nozzle to neutralize static charges on the top surface of at least one wafer (e.g., in a downward direction). The method may further comprise removing the ionized inert gas (e.g., ionized nitrogen) supplied from the at least one bottom nozzle and from the at least one top nozzle along with neutralized particles dislodged from at least one of the top surface or the bottom surface out of the chamber (e.g., load lock chamber) through at least one exhaust vent/port.

The above sequence may be incorporated into existing vacuum-vent cycles so as to not affect wafer throughput. The above sequence may be performed in any of the chamber systems, load lock systems, and any of the wafer processing systems described herein. The chamber systems, load lock systems, wafer processing systems, and static charge/particle removal methods described herein may beneficially neutralize static charges on all surfaces of a wafer and reduce particle contamination. Reduction in wafer static charges may improve cleanliness, yield, quality of wafers produced, and the overall performance of a chip.

As used herein, the singular forms "a," "an," and "the" include plural references unless the context clearly indicates otherwise. Thus, for example, reference to "a wafer" includes a single wafer as well as two or more wafers; and reference to a "nozzle" includes a single nozzle as well as two or more nozzles, and the like.

As used herein, the term "about" in connection with a measured quantity, refers to the normal variations in that measured quantity, as expected by one of ordinary skill in the art in making the measurement and exercising a level of care commensurate with the objective of measurement and the precision of the measuring equipment. In certain embodiments, the term "about" includes the recited number±10%, such that "about 10" would include from 9 to 11.

Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to illuminate certain materials and methods and does not pose a limitation on scope. No language in the specification should be construed as indicating any non-claimed element as essential to the practice of the disclosed materials and methods.

Figure 1:
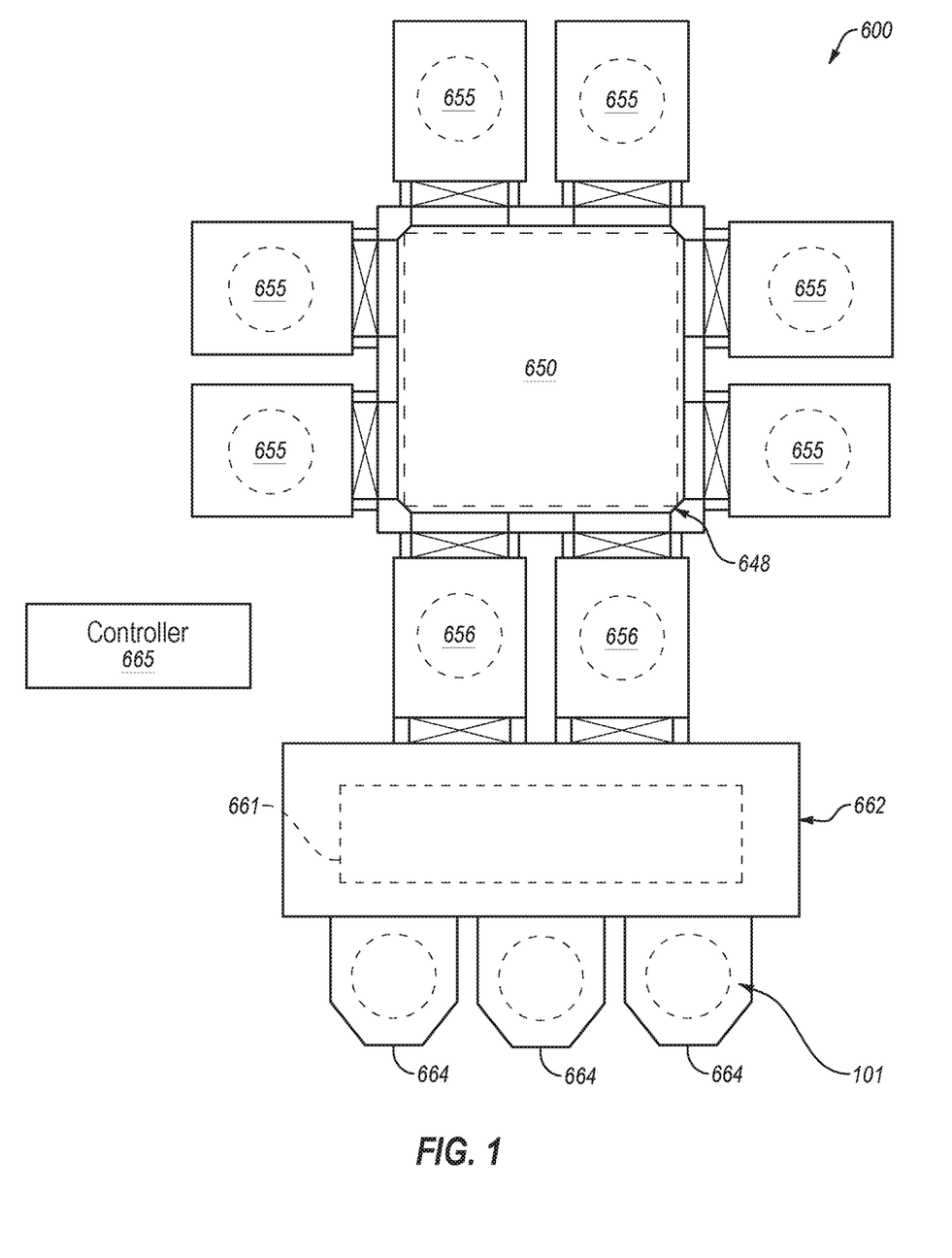
FIG. 1 illustrates a top schematic of an electronic device manufacturing apparatus in accordance with embodiments of the present disclosure.

FIG. 1 illustrates a top schematic of an electronic device manufacturing apparatus 600 in accordance with embodiments of the present disclosure. Electronic device manufacturing apparatus 600, also referred to herein as a substrate/wafer processing system, may include a factory interface 662 (also referred to as "equipment front end module (EFEM)"), a main frame 648 (also referred to as a transfer chamber), one or more processing chambers 655, and one or more load lock chambers 656 according to embodiments described herein. Main frame 648 may be connected to factory interface 662 via the one or more load lock chambers 656. Wafer carriers 664 may be detachably connected to a front wall of the factory interface 662. Factory interface 662 may include a factory interface robot 661 for moving wafer 101 (shown dotted for illustration purposes) between wafer carriers 664 and load lock chambers 656. For instance, factory interface 662 may include one or more load ports, each of which may receive a wafer carrier 664. An overhead track (OHT) may drop a front opening unified pod (FOUP) onto a load port. Factory interface robot 661 may pick wafer 101 from the FOUP and may optionally align wafer 101 in an aligner (not shown). Subsequently, factory interface robot 661 may place wafer 101 in load lock chamber 656. Load lock chamber 656 may pump down to vacuum. Thereafter, main frame robot 650 (located in main frame 648) may pick wafer 101 from at least one of load lock chambers 656 and hand wafer 101 to at least one of the one or more processing chambers 655.

As the manufacturing processes progress, the factory interface robot 661 and the main frame robot 650, working in tandem, may move wafers 101 between the wafer carriers 664 and the processing chambers 655. Various electronic device fabrication processes, e.g., semiconductor device manufacturing processes, such as, e.g., oxidation, thin film deposition, etching, heat treatment, degassing, cool down, etc., may take place within process chambers 655.

After processing in at least one of the one or more processing chambers 655 is complete, processed wafer 101 may be picked by main frame robot 650 and handed over to at least one of load lock chambers 656. At least one of load lock chambers 656 may pump its pressure up to atmospheric pressure followed by the processed wafer 101 being picked by the factory interface robot 661 and placed back into the FOUP. After all wafers from wafer carriers 664 are processed, the OHT (not shown) may pick the FOUP and drop it with a different tool as per the designed manufacturing process.

In some wafer processing systems, ionizers (e.g., ion bars), are placed in the EFEM. The ion bars produce positively and negatively charged ions. The laminar flow of the EFEM transports the ions to the wafer(s) in different parts of the EFEM to neutralize static charges on the wafer(s). In certain embodiments, ionized gas is flowed in one or more load lock chambers instead of or in addition to being flowed in one or more parts of the EFEM. Embodiments of the instant disclosure contemplate introducing ions to the statically charged wafers at the load lock chamber 656 (in FIG. 1) or 200 (in FIGS. 2-3), i.e., closer to the wafer processing environment. Other embodiments of the instant disclosure contemplated introducing ions to statically charged wafers in other chambers within the wafer processing system.

Figure 2:
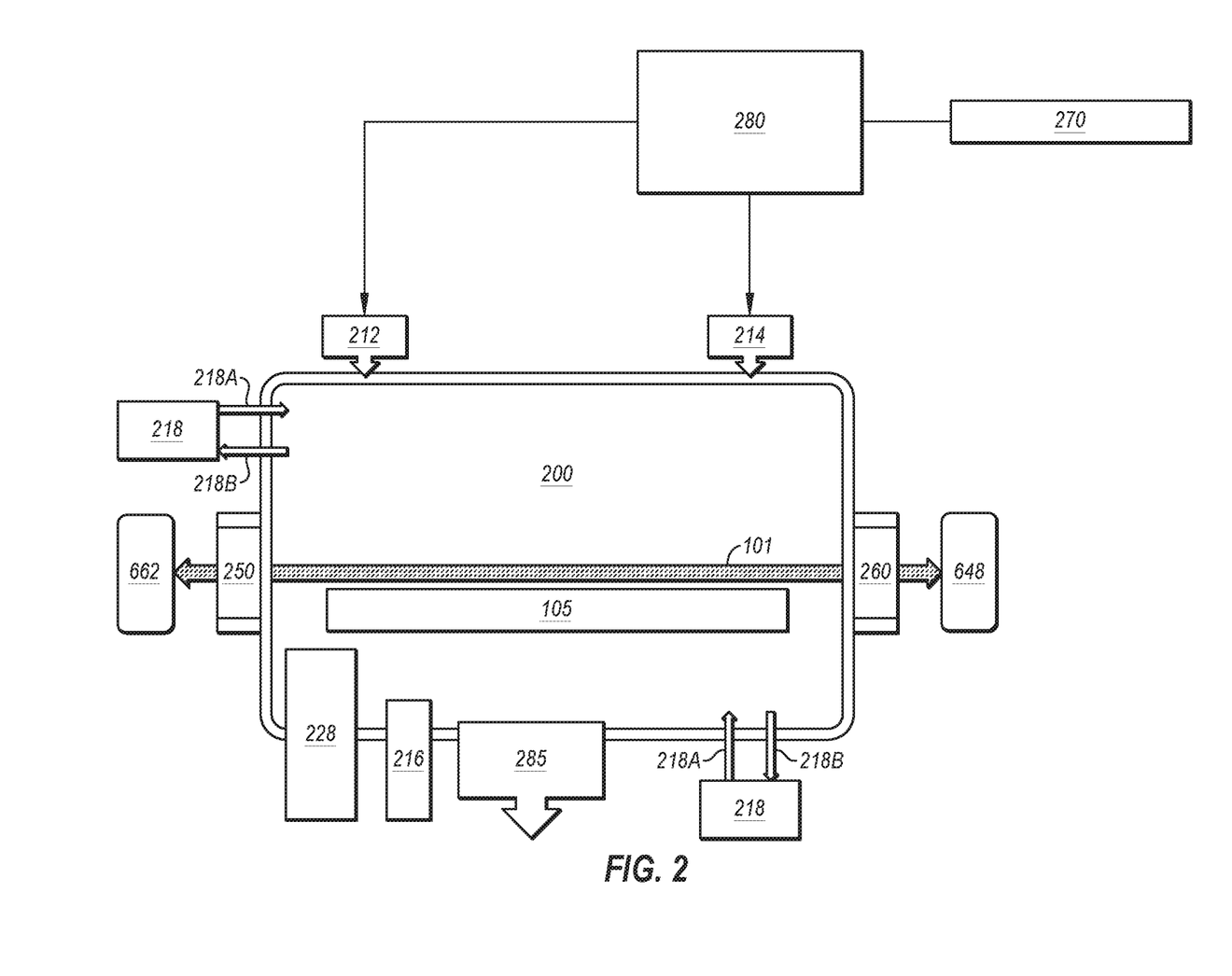
FIG. 2 illustrates a schematic of a single wafer load lock chamber in accordance with embodiments of the present disclosure.

One or more load lock chambers 656 in apparatus 600 may be described in greater detail with respect to FIG. 2. The load lock chamber 656 may correspond to load lock chambers 656 of FIG. 1. FIG. 2 depicts a schematic of a single wafer load lock system according to certain embodiments. The load lock system may comprise a load lock chamber 200 (similar to load lock chamber 656 in FIG. 1). The environment in load lock chamber 200 can be switched between an atmospheric state and a depressurized vacuum state. All the embodiments described herein with respect to load lock chamber systems depicted in FIGS. 2, 3, 4, 5, 6 may also apply to other chambers that can be isolated and vented/pumped within a wafer processing system. Such other chamber may or may not be vacuum chambers.

Figure 3:
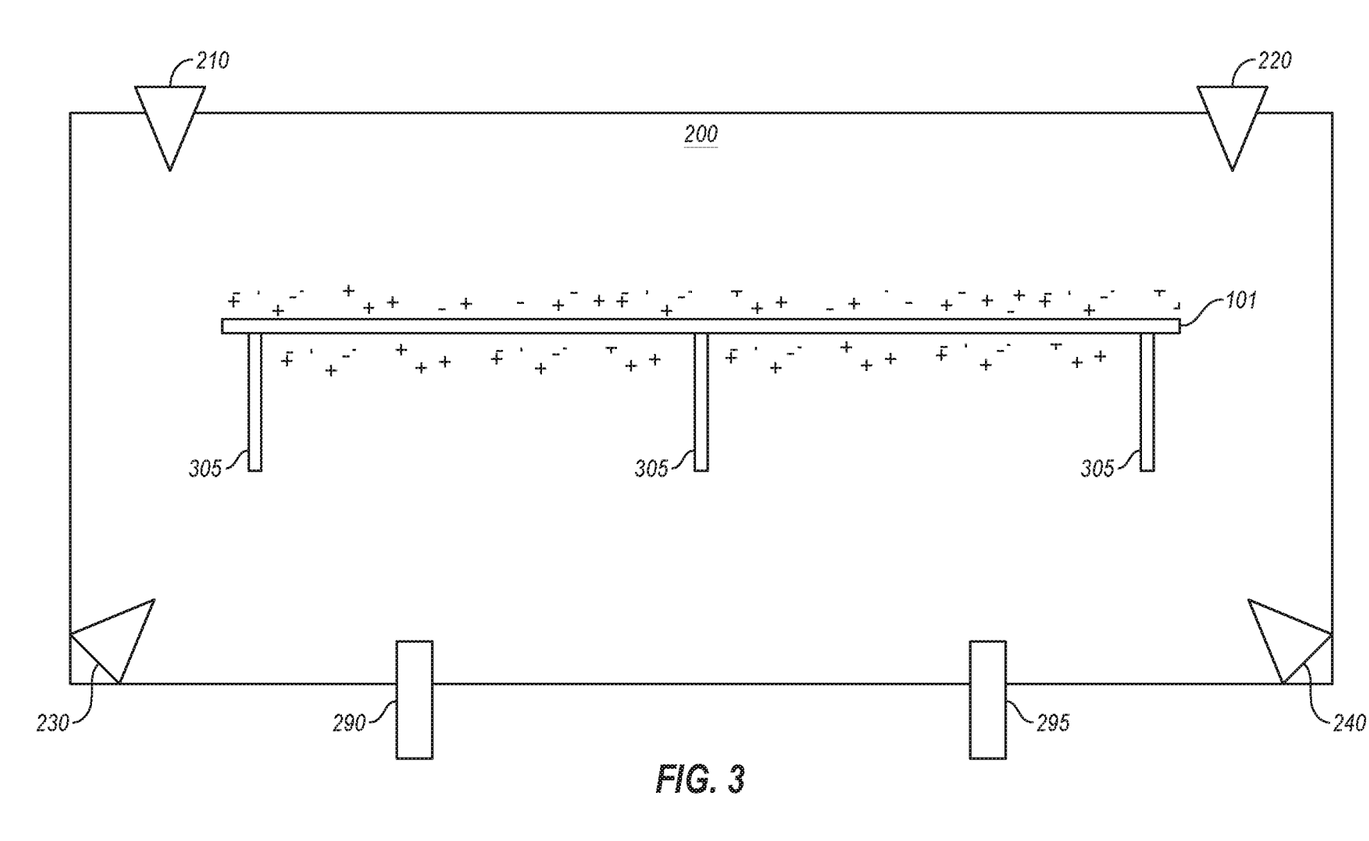
FIG. 3 illustrates a simplified schematic of a single wafer load lock chamber depicting ionized gas delivery nozzle positioning in accordance with embodiments of the present disclosure.
Figure 4:
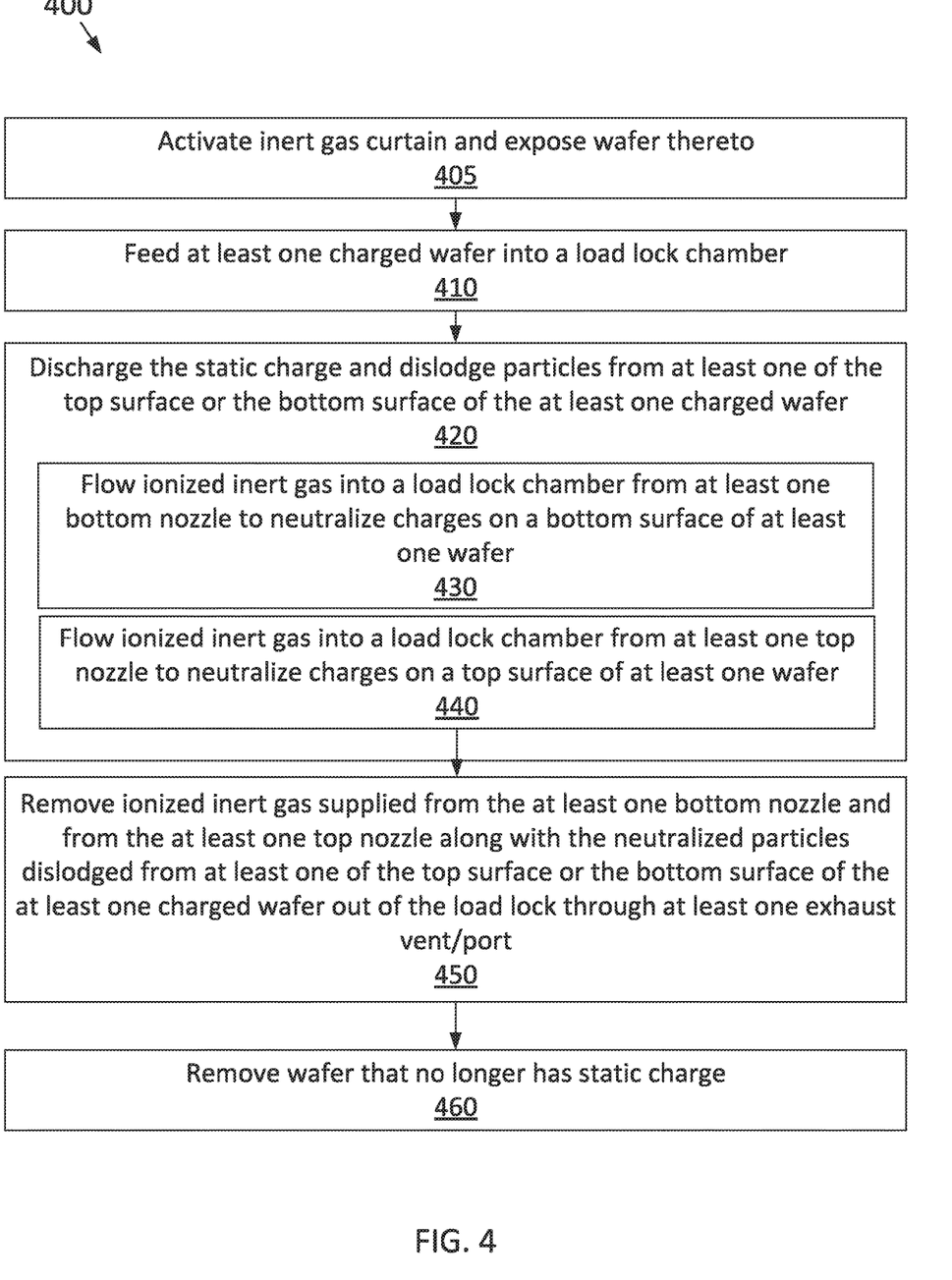
FIG. 4 depicts a flow chart of a method of flowing ionized inert gas to remove static charge on a wafer.

Load lock chamber 200 may comprise at least one bottom nozzle for flowing ionized inert gas into the load lock chamber 200 to neutralize surface charges (e.g., electrostatic charges) on a bottom surface of at least one wafer (e.g., wafer 101). For instance, load lock chamber 200 may have two bottom nozzles, with a first bottom nozzle 230 positioned at a first bottom corner of load lock chamber 200 and a second bottom nozzle 240 positioned at a second bottom corner of load lock chamber 200, as shown in FIG. 3. Alternatively, the bottom nozzles may otherwise be placed in the load lock chamber in a manner that will allow ionized inert gas flowing from them to fully expose the bottom surface of the at least one wafer to the ionized inert gas so as to neutralize static charges on a bottom surface of at least one wafer. For example, the at least one bottom nozzles may be placed in one or more sidewalls of the load lock chamber near the bottom of the load lock chamber, and may be aimed at an angle relative to the bottom (e.g., at an angle of close to 90 degrees to 60 degrees). Ionized inert gas from the bottom nozzles may flow in an upward direction (e.g., orthogonal to the bottom surface of a wafer or in an angle other than 90° relative to the bottom surface of a wafer). Some example angles include 85 degrees, 75 degrees, 60 degrees, and so on. In certain embodiments, the bottom surface of load lock chamber 200 may comprise only one bottom nozzle or more than two bottom nozzles (e.g., three, four, a manifold of bottom nozzles and so on).

Load lock chamber may further comprise at least one top nozzle for flowing ionized inert gas into the load lock chamber 200 to neutralize surface charges (e.g., electrostatic charges) on a top surface of at least one wafer (e.g., wafer 101). For instance, load lock chamber 200 may have two top nozzles, with a first top nozzle 210 positioned at a first top corner of the load lock chamber 200 and a second top nozzle 220 positioned at a second top corner of the load lock chamber 200, as shown in FIG. 3. Alternatively, the top nozzles may otherwise be placed in the load lock chamber in a manner that will allow ionized inert gas flowing from them to fully expose the top surface of the at least one wafer to the ionized inert gas so as to neutralize static charges on a top surface of at least one wafer. For example, the at least one top nozzles may be placed in one or more side walls of the load lock chamber near the top of the load lock chamber, and may be aimed at an angle relative to the top (e.g., at an angle of close to 90 degrees to 60 degrees). Ionized inert gas from the top nozzles may flow in a downward direction (e.g., orthogonal to the top surface of a wafer or in an angle other than 90° relative to the top surface of a wafer). Some example angles include 85 degrees, 75 degrees, 60 degrees, and so on. In certain embodiments, the top surface of load lock chamber 200 may comprise only one top nozzle or more than two top nozzles (e.g., three, four, a manifold of top nozzles and so on).

Load lock chamber 200 may comprise an atmospheric slit valve 250 and a vacuum slit valve 260. Atmospheric slit valve 250 may separate the internal environment of load lock chamber 200 from the atmospheric section of the substrate processing system (e.g., factory interface 662). Vacuum slit valve 260 may separate the internal environment of load lock chamber 200 from the processing environment of main frame 648 (which may be under vacuum) and of one or more processing chambers 655 (not shown in FIG. 2). The atmospheric slit valve 250 may be positioned opposite to the vacuum slit valve 260.

Atmospheric slit valve 250 may be opened when load lock chamber 200 is in atmospheric state. At that time, wafer 101 may be transferred between wafer carriers 664 (not shown in FIG. 2) and load lock chamber 200 via factory interface 662 (e.g., with the assistance of factory interface robot 661). When atmospheric slit valve 250 is closed, ionized inert gas (e.g., ionized nitrogen or ionized argon) may be flowed into load lock chamber 200 through the at least one top nozzle and/or through the at least one bottom nozzle to neutralize static charges on the bottom and/or top surface of the wafer. Additionally, the ionized inert gas may dislodge particles on the top surface and/or bottom surface of the wafer(s). The particles may have been statically coupled to the surface of the wafer(s) via static charge in the wafer(s). Thereafter, the ionized inert gas supplied to the load lock chamber through the at least one top nozzle and/or through the at least one bottom nozzle may be removed along with any neutralized particles that dislodged from the top surface and/or the bottom surface of the wafer through at least one exhaust vent/port. Additionally, the pressure of load lock chamber 200 may be pumped down to a depressurized vacuum state that matches the vacuum of main frame 648.

When load lock chamber 200 is in a depressurized vacuum state, vacuum slit valve 260 may be opened. At that time, wafer 101 may be transferred between load lock chamber 200 and one or more processing chambers 655 via main frame 648 (e.g., with the assistance of main frame robot 650).

After wafer processing, wafer 101 may be transferred from the one or more processing chambers 655 via main frame 648 (e.g., with the assistance of main frame robot 650) back into load lock chamber 200 through open vacuum slit valve 260. Once processed wafer 101 is placed in load lock chamber 200, vacuum slit valve 260 may be closed and the pressure in load lock chamber 200 may be pumped up to atmospheric pressure that matches that of factory interface 662. In some embodiments, ionized inert gas is flowed to discharge any newly accumulated static charge on the wafer prior to pumping the load lock chamber 200 up to atmospheric pressure. Once atmospheric pressure is reached in load lock chamber 200, atmospheric slit valve 250 may be opened and processed wafer 101 may be transferred back into wafer carriers 664 via factory interface 662 (e.g., with the assistance of factory interface robot 661).

Load lock chamber 200 may be subjected to a vacuum-vent cycle when wafer 101 is inside load lock chamber 200. In one embodiment, the vacuum-vent cycle may be performed only when wafer 101 is placed in load lock chamber 200 to undergo processing in the at least one processing chambers 655 (i.e., no vacuum-vent cycle is performed after wafer 101 has been processed and is placed in the load lock chamber to exit the main frame 648). In another embodiment, the vacuum-vent cycle may be performed when wafer 101 is placed in load lock chamber 200 to undergo processing in the at least one processing chambers 655 and after wafer 101 has been processed and is placed in the load lock chamber to exit the main frame 648.

During a vacuum-vent cycle, atmospheric slit valve 250 and vacuum slit valve 260 may be closed. A vacuum-vent cycle may comprise flowing ionized inert gas (e.g., ionized nitrogen or ionized argon) into load lock chamber 200 via at least one bottom nozzle to neutralize static charges on the bottom surface of wafer 101. A vacuum-vent cycle may further comprise flowing ionized inert gas (e.g., ionized nitrogen or ionized argon) into load lock chamber 200 via at least one top nozzle to neutralize static charges on the top surface of wafer 101. A vacuum-vent cycle may further comprise removing the ionized inert gas that was supplied into the load lock chamber from the at least one bottom nozzle and from the at least one top nozzle along with any neutralized particles dislodged from at least one of the top surface and/or the bottom surface of wafer 101 out of load lock chamber 200 through at least one exhaust vent/port. The ionized inert gas and neutralized particle removal may occur while simultaneously pumping down the pressure to reach depressurized vacuum state in load lock chamber 200.

The ionized inert gas may be introduced into load lock chamber 200 by flowing inert gas from an inert gas source 270 (e.g., nitrogen facility) through an inline ionizer unit 280 to generate the ionized inert gas (i.e., convert inert gas into ionized inert gas) before flowing it through the at least one bottom nozzle and/or through the at least one top nozzle. Any ionized inert gas supplied into load lock 200 may flow through nozzles, manifolds, and tubes made of materials that are compatible with ionized inert gas, such as, without limitations, Teflon. Any dry inert gas (without moisture) that can be ionized may be used, such as, without limitations, ionized nitrogen, ionized argon.

Venting (i.e., inert gas or ionized inert gas removal and/or neutralized particle removal) may occur through at least one exhaust vents/ports that may be positioned at the bottom of a load lock chamber. For instance, load lock chamber 200 may have two bottom exhaust vents/ports, such as a first exhaust vent/port 290 positioned at a first position at the bottom of the load lock chamber between the first bottom corner and the second bottom corner and a second exhaust vent/port 295 positioned at a second position at the bottom of the load lock chamber between the first bottom corner and the second bottom corner, as shown in FIG. 3. In one embodiment, the first exhaust vent/port 290 and the second exhaust vent/port 295 may be positioned between the first bottom nozzle 230 and the second bottom nozzle 240, as shown in FIG. 3. Alternatively, the exhaust vents/ports may be placed in any position in the load lock chamber that will allow efficient removal of ionized inert gas supplied to the load lock chamber along with the neutralized particles dislodged from at least one of the top surface and/or the bottom surface of the wafer. In certain embodiments, the bottom surface of load lock chamber 200 may comprise one bottom exhaust vent/port or more than two exhaust vents/ports (e.g., three, four, a manifold of exhaust vents/ports and so on). In some embodiments, a roughening port, such as a roughening pump 285 may be used to evacuate load lock 200 from the inert gas (e.g., nitrogen, ionized nitrogen, argon, or ionized argon).

At least one ionizer, such as inline ionizer unit 280, may be positioned outside or inside load lock chamber 200. Although only one ionizer unit 280 is depicted in FIG. 2, the load lock system may comprise at least one additional ionizer unit. For instance, a first ionizer may generate ionized inert gas that may be supplied to the at least one bottom nozzle, a second ionizer may generate ionized inert gas that may be supplied to the at least one top nozzle, and/or a third ionizer may generate ionized inert gas that may be supplied to an inert gas curtain flowed proximate to the interface between the load lock chamber and a factory interface by the load loch chamber's atmospheric slit valve (described in further detail below).

Ionized inert gas flowed through the at least one top nozzle and/or through the at least one bottom nozzle may pass through a filter/diffuser, such as filter/diffuser 212 and 214. The filter/diffuser may be a net-shaped metal filter with a large gas discharge area to allow ionized inert gas to be uniformly discharged over a large area without swirling up in the load lock chamber 200. The filter/diffuser may also assist with controlling the pressure in load lock chamber 200. A filter/diffuser may optionally be present at each ionized inert gas inlet. In some embodiments, a filter/diffuser may be present at certain ionized inert gas inlets and absent in other ionized inert gas inlets (for instance, ionizer inert gas passing through the at least one top nozzle may pass through a filter/diffuser and the ionizer inert gas passing through the at least one bottom nozzle may not and vice versa). The material of constructions of a filter/diffuser, if present, may be such that prevents conversion of ions in the ionized inert gas into neutral molecules and may have a structure that allows for a long lifetime of ions.

The at least one wafer in load lock chamber 200 may be positioned on a cooling pedestal 105 (shown in FIG. 2) and/or on pads or pins 305 (shown in FIG. 3). The temperature in load lock chamber 200 may be controlled with load lock heater(s) 216 and cooling water 218 (which may have an inlet port 218A and outlet port 218B on the top of load lock chamber 200 and on the bottom of load lock chamber 200). Load lock chamber 200 and wafer 101 may be coupled to an indexer 228 for moving wafer 101 up and down in the load lock as well as in and out of the load lock. The indexer may be controlled by a motor (not shown in the FIGs). The load lock design and various units coupled to the load lock chamber described herein (such as, without limitations, pads/pins 305, cooling pedestal 105, load lock heater 216, cooling water 218 and its corresponding inlet ports 218A and outlet ports 218B, indexer 228, and so on) should be construed as merely non-limiting examples. Other suitable load-lock chamber designs having some of these units or other suitable units may also be utilized with the embodiments disclosed herein. Other placements for the various units may also be suitable with embodiments disclosed herein.

In certain embodiments, the load lock system may further comprise at least one additional nozzle 610 (FIG. 6), positioned by the atmospheric slit valve 250 that separates the load lock chamber 200 from an atmospheric section. An inert gas curtain (e.g., nitrogen or ionized nitrogen) may be flowed proximate to the interface between the factory interface and the load lock chamber 200 from the at least one additional nozzle 610. The term "proximate" indicates, in some embodiments, that the inert gas curtain 615 flows within a distance of up to about 100 mm from the entry to the load lock chamber or the exit from the load lock chamber (e.g., the atmospheric slit valve of the load lock chamber). The inert gas curtain 615 may further reduce the number of particles entering into the load lock chamber.

Figure 6:
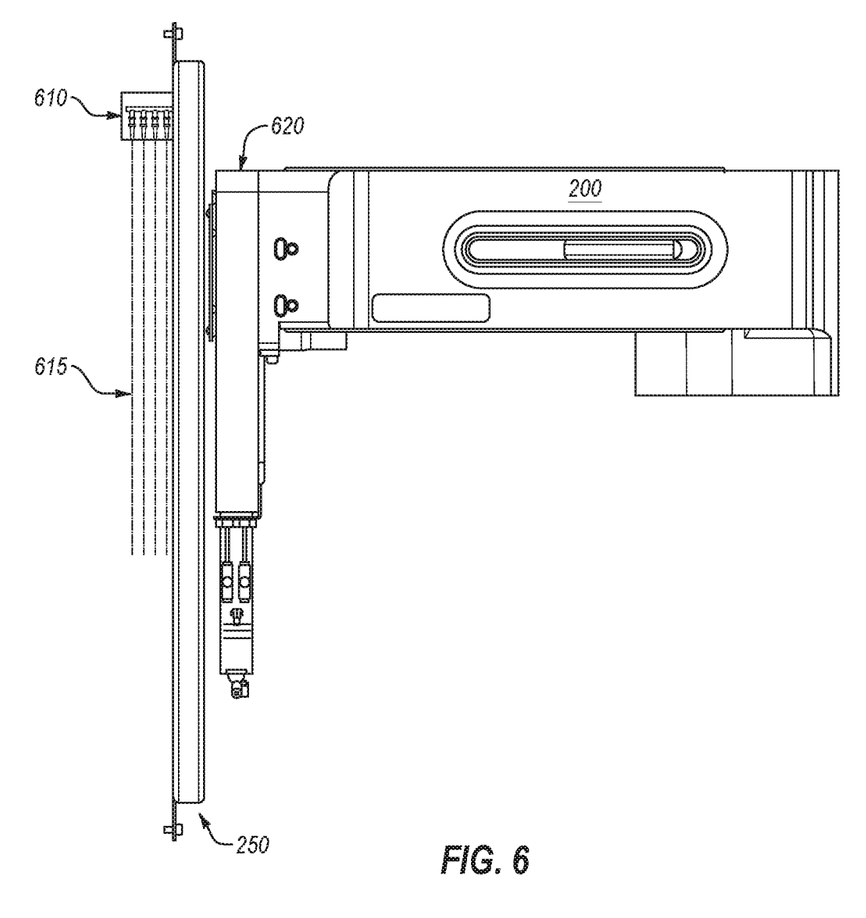
FIG. 6 depicts a schematic of an inert gas curtain proximate to an atmospheric slit valve of a load lock chamber in accordance with embodiments of the present disclosure.

The inert gas curtain 615 and the at least one additional nozzle 610 through which it may flow may be positioned inside the load lock chamber 200 or outside the load lock chamber 200 (i.e., on the factory interface 662 side). In one embodiment, the inert gas curtain and nozzle(s) may be placed by the atmospheric slit valve 250, at the entrance to the load lock chamber 200, on the factory interface 662 side, to reduce the amount of particles entering the load lock chamber 200 when the atmospheric slit valve 250 opens. Positioning the inert gas curtain and at least one additional nozzle on the factory interface side, as opposed to inside the load lock chamber, allows for a smaller sized load lock chamber since less equipment is introduced inside the load lock chamber.

In another embodiment, the inert gas curtain and the at least one additional nozzle may be placed by the atmospheric slit valve 250, at the entrance to the load lock chamber 200, and inside the load lock chamber 200, proximate to a rear interface panel 620 between EFEM and atmospheric slit valve 250.

The inert gas curtain may be supplied through a single nozzle or a plurality of nozzles. In some embodiments, the at least one inert gas curtain supplying nozzle may be positioned above the atmospheric slit valve of the load lock chamber and flow inert gas in a downward direction. In some embodiments, the at least one inert gas curtain supplying nozzle may be positioned below the atmospheric slit valve of the load lock chamber and flow inert gas in an upward direction. In some embodiments, the at least one inert gas curtain supplying nozzle may be positioned on one side by the atmospheric slit valve of the load lock chamber and flow inert gas towards the opposite direction. In some embodiments, a plurality of inert gas supplying nozzles may be positioned in different locations relative to the atmospheric slit valve of the load lock chamber and flow inert gas in various directions so as to effectively reduce the number of particles remaining on the at least one wafer transferred through the inert gas curtain.

Regardless of the positioning of the at least one additional inert gas curtain supplying nozzle (inside the load lock chamber or outside the load lock chamber), the inert gas curtain may be activated when wafer 101 is transferred from factory interface 662 into load lock chamber 200 and/or when processed wafer 101 is transferred from load lock chamber 200 back into factory interface 662. In other words, the inert gas curtain may flow proximate to the interface between the factory interface and the load lock chamber when a wafer is transferred between the factory interface and the load lock chamber (or between the load lock chamber and the factory interface) in order to expose the wafer to the inert gas curtain to facilitate further particle removal from the wafer.

The inert gas curtain may be supplied through a manifold and form an inert gas curtain manifold. In certain embodiments, the inert gas curtain comprises ionized inert gas (e.g., ionized nitrogen or ionized argon). The ionized inert gas may be generated by flowing inert gas through at least one additional inline ionizer (such as ionizer unit 280 that generated ionized inert gas from an inert gas source 270). In one embodiment, a single inline ionizer unit 280 may be used to generate the ionized inert gas curtain and the ionized inert gas to the at least one bottom nozzle in the load lock chamber and the ionized inert gas to the at least one top nozzle in the load lock chamber. In another embodiment, a plurality of ionizers may be used to supply ionized inert gas for various purposes (e.g., one for the at least one bottom nozzle in the load lock chamber, a second one for the at least one top nozzle in the load lock chamber, and a third one for the ionized inert gas curtain).

FIG. 3 illustrates a simplified schematic of a single wafer load lock chamber depicting ionized gas delivery nozzle positioning in accordance with embodiments of the present disclosure. The following is a description of a method that may be used for preventing particles from adhering and/or removing particles that have already adhered to wafer 101 by neutralizing the charge on wafer 101 in course of transferring the wafer between factory interface and main frame. In certain embodiments, methods described herein may relate to a sequence of transferring the wafer between the factory interface and the main frame. In certain embodiments, methods described herein may relate to a purge sequence of a load lock chamber. These methods may be described in detail with respect to method 400 illustrated in FIG. 4.

An inert purge gas (e.g., nitrogen gas or argon gas) may be supplied by an inert gas source 270 (shown in FIG. 2) into load lock chamber 200 to maintain load lock chamber 200 in atmospheric pressure. In this state, atmospheric slit valve 250 may be opened and wafer 101 may be transferred from wafer carriers 664 (shown in FIG. 1) to load lock chamber 200 through factory interface 662 with the assistance of factory interface robot 661. At this time, inert gas curtain 615 may be activated and wafer 101 may be exposed thereto as the wafer is being transferred into load lock chamber 200, in accordance with block 405. Once at least one charged wafer is fed into the load lock chamber in accordance with block 410, atmospheric slit valve 250 may be closed.

Wafer 101 in load lock chamber 200 may be positioned on a pads or pins 305. Wafer 101 may be electrically charged as shown by the positive and negative charges depicted on the top surface and on the bottom surface of wafer 101 in FIG. 3. In order to neutralize the charges on the wafer in load lock chamber 200 and prevent adhesion of particles by electrostatic forces to the wafer, the following charge neutralization and particle removal processes may be carried out.

When atmospheric slit valve 250 is closed, an inline ionizer may be turned on in order to generate ionized inert purge gas and supply ionized inert gas (e.g., ionized nitrogen gas or ionized argon gas) into load lock chamber 200. In certain embodiments, a first ionizer may be turned on to generate ionized inert gas supplied to at least one bottom nozzle. In one embodiment, the method may comprise flowing ionized inert gas into load lock chamber from at least one bottom nozzle (e.g., a first bottom nozzle 230 and a second bottom nozzle 240) in load lock chamber 200, pursuant to block 430 in FIG. 4. The ionized inert gas from the two bottom nozzles may flow in an upward direction (e.g., orthogonal to the bottom surface of the wafer within the load lock chamber or in angle other than a right angle). The ionized inert gas from the two bottom nozzles may flow onto the bottom surface of the wafer in its entirety (or a substantial portion of the bottom surface of the wafer) so as to neutralize charges on the bottom surface of wafer 101, pursuant to block 430 in FIG. 4.

Once charges on the bottom surface of the wafer are neutralized, the at least one bottom nozzle (e.g., nozzles 230 and 240) may be closed and the first ionizer used for ionizing inert gas supplied to the at least one bottom nozzle may be turned off. At this time (or after an optional delay), a second ionizer may be turned on to generate ionized inert gas supplied to at least one top nozzle. In certain embodiments, a single ionizer may be used to generate ionized inert gas that may be supplied to the at least one bottom nozzle (e.g., 230 and 240) and to the at least one top nozzle (e.g., 210 and 220). In one embodiment, the method may comprise flowing ionized inert gas from at least one top nozzle (e.g., a first top nozzle 210 and a second top nozzle 220) into load lock chamber 200, pursuant to block 440 in FIG. 4. The ionized inert gas from the two top nozzles may be configured to flow in a downward direction (e.g., orthogonal to the top surface of the wafer within the load lock chamber or in an angle other than a right angle). The ionized inert gas from the two top nozzles may flow in a manner that would expose the top surface of the wafer in its entirety (or a substantial portion of the top surface of the wafer) so as to neutralize charges on the top surface of the wafer, pursuant to block 440 in FIG. 4.

In the sequence described above, the ionized inert gas may effectively contact with the bottom surface of the wafer by supplying ionized inert gas flowing from the bottom portion of a load lock chamber toward the ceiling/top portion of a load lock chamber (when the at least one bottom nozzle is opened and the at least one top nozzle is closed and correspondingly when an ionizer supplying ionized inert gas to the at least one bottom nozzle is on and when an ionizer supplying ionized inert gas to the at least one top nozzle is paused). This may neutralize electrostatic charges on the bottom surface of the wafer and minimize, prevent, or remove particles adhered to the bottom surface of the wafer. Subsequently, the ionized inert gas may effectively contact with the top surface of the wafer by supplying ionized inert gas flowing from the top/ceiling portion of a load lock chamber to the bottom portion of a load lock chamber (when the at least one top nozzle is opened and the at least one bottom nozzle is closed and correspondingly when an ionizer supplying ionized inert gas to the at least one bottom nozzle is paused and when an ionizer supplying ionized inert gas to the at least one top nozzle is on). This may neutralize electrostatic charges on the top surface of the wafer and minimize, prevent, or remove particles adhered to the top surface of the wafer. Ultimately, this sequence may discharge the static charge and dislodge particles from at least one of the top surface or the bottom surface of the at least one charged wafer, pursuant to block 420 in FIG. 4.

Once electrostatically charged surfaces of the wafer have been neutralized and particles adhered thereon have been neutralized (or after an optional delay), at least one exhaust vent/port (e.g., first exhaust vent 290 and second exhaust vent 295) may be opened and the charge-neutralized particles that dislodged from the surface of the wafer may be removed without being adhered to the wafer or to internal surface of the load lock chamber. In addition to the neutralized particles dislodged from at least one of the top surface or the bottom surface of the at least one charged wafer being removed out of the load lock through the at least one exhaust vent/port, the ionized inert gas supplied from the at least one bottom nozzle and from the at least one top nozzle may also be removed through the at least one exhaust vent/port, pursuant to block 450 in FIG. 4. The at least one exhaust vent/port may operate while the pressure in load lock chamber 200 is being pumped down to achieve a vacuum state.

Ionizers that supply ionized inert gas into the at least one top nozzle and/or into the at least one bottom nozzle may be paused during the vent portion of a vacuum-vent cycle (i.e., when ionized inert gas and neutralized particles are being removed from the load lock chamber through at least one exhaust vent/port). Ionizers that supply ionized inert gas into the at least one top nozzle and/or into the at least one bottom nozzle may also be paused when a wafer is being transferred into a load lock chamber and/or out of a load lock chamber. In certain embodiments, the ionizers that supply ionized inert gas into the at least one top nozzle and/or into the at least one bottom nozzle may operate in a fragmented, non-continuous, manner when flowing the ionized inert gas into the load lock chamber.

The sequence described above regarding operation of the at least one bottom nozzle, the at least one top nozzle, and the at least one exhaust vent/port may be repeated cyclically until substantially all the charges on substantially all surfaces of the wafer have been neutralized and until substantially all the charge-neutralized particles have been removed from the load lock chamber. Once load lock chamber 200 reached a target vacuum pressure, wafer surface charge neutralization, and particle removal state, vacuum slit valve 260 may be opened and the wafer may be removed from the load lock chamber, pursuant to block 460 in FIG. 4, and transferred through the main frame 648 to a processing chamber 655 with the assistance of a main frame robot 650.

After processing of the wafer in one or more processing chambers 655 is complete, the processed wafer may be returned to load lock chamber 200 through vacuum slit valve 260 with the assistance of main frame robot 650. Once processed wafer 101 is entered into load lock chamber 200, vacuum slit valve 260 may close. Thereafter, load lock chamber 200 may be subjected to a similar vent-vacuum cycle as was previously described (blocks 420, 430, 440, and 450) to remove any newly accumulated static charges and/or particles on the processed wafer. Subsequently, the pressure in load lock chamber 200 may increase to atmospheric pressure. Once the pressure in load lock chamber 200 reaches atmospheric pressure, atmospheric slit valve 250 opens and processed wafer 101 that no longer has static charge may be transferred back to the EFEM with the assistance of factory interface robot 661. During the processed wafer transfer from load lock chamber 200 to the EFEM, inert gas curtain 615 may be activated to expose the processed wafer to inert gas to further remove static charges and/or particles therefrom.

Certain embodiments of the instant disclosure may be suitable for a single wafer load lock, such as the one depicted in FIGS. 2-3. Other embodiments of the instant disclosure may be suitable for a multi-wafer batch load lock chamber 500, depicted in FIG. 5 (e.g., a load lock chamber that includes about 25-35 wafers arranged in a wafer comb 550 inside the chamber body). The environment in load lock chamber 500 can be switched between an atmospheric state and a depressurized state, similarly to single wafer load lock chamber 200.

Figure 5:
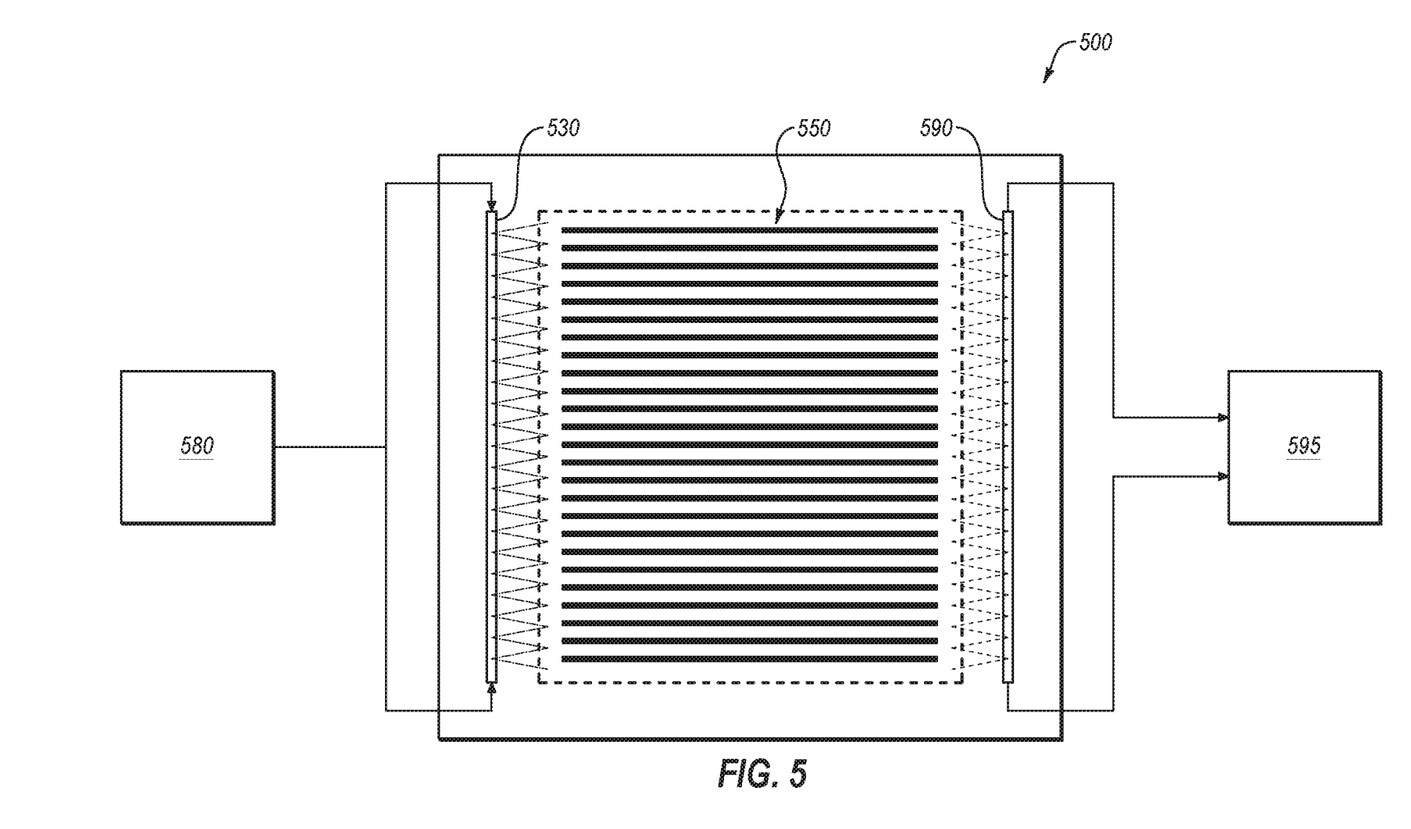
FIG. 5 illustrates a schematic of a multi-wafer load lock chamber in accordance with embodiments of the present disclosure.

In certain embodiments, the multi-wafer batch load lock chamber 500 may comprise at least one individualized bottom nozzle configured to flow ionized inert gas to neutralize charges on the bottom surface of each wafer and at least one individualized top nozzle configured to flow ionized inert gas to neutralize charges on the top surface of each wafer. In certain embodiments, the multi-wafer batch load lock chamber 500 may comprise a plurality of nozzles placed throughout the load lock chamber in positions that could flow ionized inert gas to the various surfaces (e.g., bottom surface, top surface, sides, and so on) in a localized targeted manner to as efficiently neutralize charges on various surfaces of the wafers contained in the load lock chamber. In some embodiments, a plurality of bottom and/or top nozzles may be spaced apart and positioned on one side of the multi-wafer load lock chamber 500 (spread out from top to bottom). In some embodiments, the bottom and/or top nozzles may be positioned on two opposite sides of the multi-wafer load lock chamber 500 (spread out from top to bottom). The bottom and/or top nozzles supplying the ionized inert gas to a multi-wafer batch load lock chamber may be connected to a centralized purge line 530 for supplying ionized inert gas for the bottom and/or top nozzles of all wafers in the chamber. In other embodiments, a dedicated purge line (not shown) may be connected to a set of bottom and/or top nozzles dedicated for a particular wafer in the wafer comb 550.

The ionized inert gas (e.g., ionized nitrogen) may be delivered to the multi wafer load lock chamber 500 in a similar manner as to the single wafer load lock chamber 200. The ionized inert gas may be introduced into multi wafer load lock chamber 500 by flowing inert gas from an inert gas source (e.g., nitrogen facility) through an inline ionizer unit 580 to generate the ionized inert gas (i.e., convert inert gas into ionized inert gas) before flowing it through a centralized purge line 530 into a plurality of inlet nozzles (e.g., as a manifold that may supply ionized inert gas individually for every wafer in the wafer comb 550). The plurality of inlet nozzles may be positioned inside the multi wafer load lock chamber 500 (e.g., spaced apart from top to bottom on one side of the load lock chamber or on two opposite sides of the load lock chamber). The inline ionizer unit 580 may be positioned outside multi wafer load lock chamber 500. Any ionized inert gas supplied into multi wafer load lock chamber 500 may flow through nozzles, manifolds, and tubes made of materials that are compatible with ionized inert gas, such as, without limitations, Teflon. Any dry inert gas (without moisture) that can be ionized may be used, such as, without limitations, ionized nitrogen, ionized argon.

Venting (i.e., inert gas or ionized inert gas removal and/or neutralized particle removal) may occur through at least one exhaust vents/ports 590 (e.g., as a manifold connected to a centralized vent line 595) that may be positioned on the side of the multi wafer load lock chamber (see FIG. 5) and/or at the bottom of the multi wafer load lock chamber 500 (e.g., similar to the positioning of exhaust vents/ports 290 and 295). In some embodiments, a plurality of exhaust vents/ports may be spaced apart from top to bottom on two opposite sides of a load lock chamber 500. In some embodiments, a centralized exhaust line 590 may be used to remove ionized inert gas supplied from the plurality of top and/or bottom nozzles and any neutralized particles dislodged from the plurality of wafers in wafer comb 550. In other embodiments, multi wafer load lock chamber 500 may comprise a plurality of exhaust lines (not shown), each dedicated to its particular wafer in the wafer comb 550. Each dedicated exhaust line may remove ionized inert gas supplied from the plurality of top and/or bottom nozzles (that may be dedicated to the same particular wafer) and any neutralized particles dislodged from its particular wafer. Alternatively, the exhaust vents/ports may be placed in any position in the multi wafer load lock chamber 500 that will allow efficient removal of ionized inert gas supplied to the load lock chamber along with the neutralized particles dislodged from at least one of the top surface and/or the bottom surface of the at least one wafer. In certain embodiments, the bottom surface of multi wafer load lock chamber 500 may comprise one bottom exhaust vent/port or more than two exhaust vents/ports (e.g., three, four, a manifold of exhaust vents/ports and so on).

In certain embodiments, multi-wafer batch load lock chambers may comprise additional components described hereinbefore with respect to a single wafer load lock chamber, such as, at least one exhaust vent/port, pedestal and/or pins and/or pads for supporting the wafer(s), cooling water, atmospheric slit valve, vacuum slit valve, inert gas curtain, and so on.

The substrate/wafer processing system described herein may be computer-controlled by a control unit (not shown). By executing programs (software) for processing wafer 101 based on predetermined recipes, various driving units of the substrate processing system operate and process wafer 101.

Further, it is to be understood that the methods disclosed herein may be attained by supplying to a computer e.g., a control unit) a storage medium in which a program code of software that realizes the functions of the aforementioned embodiments is stored, and then causing a processor (e.g., a central processing unit (CPU)) of the computer to read out and execute the program code stored in the storage medium. Alternatively another type of processing device such as a programmable logic controller (PLC) system on a chip (SoC), etc. may execute the program code. The processor or processing device executing the program code may cause ionizers to activate, slit valves to open and/or close, inert gas to flow or stop flowing at set flow rates, wafers to be moved between locations by robots, and so on.

In this case, the program code itself read out from the storage medium realizes the functions of the aforementioned embodiments and, hence, the program code and the storage medium in which the program code is stored are also part of the disclosure.

Moreover, the storage medium for Supplying the program code may be, e.g., an RAM, an NV-RAM, a floppy (registered trademark) disk, a hard disk, a magnetic-optical disk, an optical disk such as a CD-ROM, a CD-R, a CD-RW, a DVD (a DVD-ROM, a DVD-RAM, a DVD-RW, a DVD+ RW) or the like, a magnetic tape, a non-volatile memory card, another ROM or the like. Alternatively, the program code may be supplied to the computer by downloading from another computer (not shown), a database (not shown) or the like connected to the Internet, a commercial network, an LAN (local area network) or the like.

Besides, it is to be understood that the functions of the aforementioned embodiments may be accomplished not only by executing the program code read out by the computer, but also by causing an OS (operating system) or the like that operates on the processing device to perform a part or all of the actual operations based on instructions of the program code.

The program codes may take the form of an object code, a program code executed by an interpreter, script data supplied to an OS, or the like.

In the foregoing description, numerous specific details are set forth, such as specific materials, dimensions, processes parameters, etc., to provide a thorough understanding of the present disclosure. The particular features, structures, materials, or characteristics may be combined in any suitable manner in one or more embodiments. The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is simply intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. Reference throughout this specification to "an embodiment", "certain embodiments", or "one embodiment" means that a particular feature, structure, or characteristic described in connection with the embodiment is included in at least one embodiment. Thus, the appearances of the phrase "an embodiment", "certain embodiments", or "one embodiment" in various places throughout this specification are not necessarily all referring to the same embodiment.

Embodiments of the present disclosure have been described with reference to specific exemplary embodiments thereof. The specification and drawings are, accordingly, to be regarded in an illustrative rather than a restrictive sense. Various modifications of the disclosure in addition to those shown and described herein will become apparent to those skilled in the art and are intended to fall within the scope of the appended claims.

What is claimed is:

1. A load lock system, comprising:
   a load lock chamber comprising an atmospheric slit valve for separating the load lock chamber from an atmospheric environment and a vacuum slit valve for separating the load lock chamber from a processing environment, the atmospheric slit valve positioned opposite to the vacuum slit valve;
   at least one ionizer to ionize inert gas supplied to the load lock chamber, wherein an output of the at least one ionizer is ionized inert gas;
   at least one bottom nozzle positioned at a bottom of the load lock chamber, the at least one bottom nozzle to flow the ionized inert gas onto a bottom surface of at least one wafer in the load lock chamber, wherein the ionized inert gas, when flowed onto the bottom surface of the at least one wafer, neutralizes static charge on a bottom surface of the at least one wafer;
   at least one top nozzle positioned at a top of the load lock chamber, the at least one top nozzle to flow the ionized inert gas onto a top surface of the at least one wafer, wherein the ionized inert gas, when flowed onto the top surface of the at least one wafer, neutralizes static charge on a top surface of the at least one wafer; and
   at least one exhaust vent, the at least one exhaust vent to remove the ionized inert gas and any neutralized particles dislodged from at least one of the top surface or the bottom surface from the load lock chamber.

2. The load lock system of claim 1, wherein the at least one bottom nozzle comprises a first bottom nozzle positioned at a first bottom corner of the load lock chamber and a second bottom nozzle positioned at a second bottom corner of the load lock chamber.

3. The load lock system of claim 2, wherein the at least one exhaust vent comprises a first exhaust vent positioned at a first position at the bottom of the load lock chamber between the first bottom corner and the second bottom corner and a second exhaust vent positioned at a second position at the bottom of the load lock chamber between the first bottom corner and the second bottom corner.

4. The load lock system of claim 1, wherein the at least one top nozzle comprises a first top nozzle positioned at a first top corner of the load lock chamber and a second top nozzle positioned at a second top corner of the load lock chamber.

5. The load lock system of claim 1, further comprising:
   at least one additional nozzle positioned outside the load lock chamber by the atmospheric slit valve, the at least one additional nozzle to generate an inert gas curtain at an interface of the load lock chamber and a factory interface.

6. The load lock system of claim 5, wherein the inert gas curtain is an ionized inert gas curtain, the load lock system further comprising:
   an additional ionizer to ionize additional inert gas used to generate the ionized inert gas curtain.

7. A chamber system comprising:
   a chamber comprising an atmospheric slit valve for separating the chamber from an atmospheric environment and a vacuum slit valve for separating the chamber from a processing environment, the atmospheric slit valve positioned opposite to the vacuum slit valve;
   at least one ionizer to ionize inert gas supplied to the chamber, wherein an output of the at least one ionizer is ionized inert gas;
   at least one bottom nozzle positioned at a bottom of the chamber, the at least one bottom nozzle to flow the ionized inert gas onto a bottom surface of at least one wafer in the chamber, wherein the ionized inert gas, when flowed onto the bottom surface of the at least one wafer, neutralizes static charge on a bottom surface of the at least one wafer;
   at least one top nozzle positioned at a top of the chamber, the at least one top nozzle to flow the ionized inert gas onto a top surface of the at least one wafer, wherein the ionized inert gas, when flowed onto the top surface of the at least one wafer, neutralizes static charge on a top surface of the at least one wafer; and
   at least one exhaust vent positioned at the bottom of the chamber, the at least one exhaust vent to remove the ionized inert gas and any neutralized particles dislodged from at least one of the top surface or the bottom surface from the chamber.

8. The chamber system of claim 7, wherein the at least one bottom nozzle comprises a first bottom nozzle positioned at a first bottom corner of the chamber and a second bottom nozzle positioned at a second bottom corner of the chamber, wherein the at least one top nozzle comprises a first top nozzle positioned at a first top corner of the chamber and a second top nozzle positioned at a second top corner of the chamber, and wherein the at least one exhaust vent comprises a first exhaust vent positioned at a first position at the bottom of the chamber between the first bottom corner and the second bottom corner and a second exhaust vent positioned at a second position at the bottom of the chamber between the first bottom corner and the second bottom corner.

9. The chamber system of claim 7, further comprising at least one additional nozzle to generate an inert gas curtain at a position proximate to an entry and/or an exit from the chamber.

10. The chamber system of claim 9, wherein the inert gas curtain is an ionized inert gas curtain, the chamber system further comprising:

an additional ionizer to ionize additional inert gas used to generate the ionized inert gas curtain.

\* \* \* \* \*